United States Patent

Blasko et al.

[11] Patent Number: 5,912,187
[45] Date of Patent: Jun. 15, 1999

[54] METHOD OF FABRICATING CIRCUITS

[75] Inventors: Joseph Paul Blasko, Schnecksville; Robert John Griffin, Blandon, both of Pa.

[73] Assignee: Lucent Technologies Inc., Murray Hill, N.J.

[21] Appl. No.: 08/871,489

[22] Filed: Jun. 10, 1997

Related U.S. Application Data

[63] Continuation-in-part of application No. 08/616,923, Mar. 18, 1996, abandoned, which is a continuation of application No. 08/175,444, Dec. 30, 1993, abandoned.

[51] Int. Cl.⁶ .................................................. H01L 21/00
[52] U.S. Cl. .............................. 438/719; 216/62; 216/67; 438/735
[58] Field of Search .................................. 216/2, 41, 49, 216/62, 67; 438/719, 725, 733, 735

[56] References Cited

U.S. PATENT DOCUMENTS

| | | | |
|---|---|---|---|
| 4,377,437 | 3/1983 | Taylor et al. | 216/62 |
| 4,470,871 | 9/1984 | White et al. | 216/62 |
| 4,504,574 | 3/1985 | Meyer et al. | 216/62 X |
| 4,968,552 | 11/1990 | Linde | 216/62 X |
| 5,215,867 | 6/1993 | Stillwagon et al. | 216/62 X |

*Primary Examiner*—William Powell
*Attorney, Agent, or Firm*—Anthony Grillo

[57] ABSTRACT

A method of fabricating an integrated circuit device is described in which fluorine ions are implanted into the patterned photoresist and the exposed polysilicon layer prior to etching the polysilicon. The ion implantation minimizes the chemical reaction between the photoresist and etchant, thereby significantly reducing the formation of polysilicon etch delta, and also significantly reducing etch delta variation due to pattern density variations.

9 Claims, 2 Drawing Sheets

METHOD OF FABRICATING CIRCUITS

This is a continuation-in-part of application Ser. No. 08/616,923, filed Mar. 18, 1996, now abandoned, which is a continuation of application Ser. No. 08/175,444, filed Dec. 30, 1993, now abandoned.

FIELD OF INVENTION

This invention generally relates to the fabrication of semiconductor integrated circuits, and, more specifically, to a method for reducing polysilicon etch delta sensitivity in MOS devices.

BACKGROUND OF THE INVENTION

Developments in MOS integrated circuit fabrication technology are continuously achieving reduced device size, and, particularly, reduced gate channel lengths, which are now typically about 0.6 micron and below.

In a conventional process of fabricating MOS integrated circuits, patterned layers of photoresist, such as KTI photoresists, are formed over layers of polysilicon and silicon oxide, such that those portions of the polysilicon layers, and sometimes the oxide layer, not covered by the photoresist are selectively removed in a subsequent etching step in a manner well known to those skilled in the art. The remaining features form the gates of the transistors on the device. Plasma etching has been proven to be particularly useful as an anisotropic etchant.

In an ideal process, the photoresist walls and the underlying polysilicon layers that are produced by the etching are perfectly vertical. It has been found, however, that during an etching process the etchant gas, which typically includes chlorine or a chloride, reacts with the carbon in the photoresist and the polysilicon layers, forming a material which is deposited along the walls, thereby creating sloping sidewalls. The width of the slope from the vertical wall at the substrate surface is termed the polysilicon "etch delta". The deposited material that results in the polysilicon etch delta for chlorine plasma chemistries is denoted $CCl_x$ or $SiCl_4$, respectively. However, because $SiCl_4$ is volatile, much of this residue is actually removed by reaction with the etchant gas during the etching process.

This formation of etch delta in the polysilicon sidewalls requires additional spacing between adjacent devices and thus reduces integration density. Moreover, when the process is used to fabricate integrated circuits of different layouts and dimensions, involving differing percentages of photoresist mask areas, different amounts of polysilicon etch delta are developed, which produce corresponding differences in channel lengths.

One approach that has been proposed to reduce the formation of polysilicon etch delta and decrease its sensitivity to pattern density involves the use of an oxide layer patterned by the use of a photoresist mask to form an oxide hard mask. The oxide hard mask is then used to pattern the underlying polysilicon layer. Those concerned with the development of integrated circuit processing have, however, continually sought improved methods of patterning.

SUMMARY OF THE INVENTION

These and other problems are addressed by the present invention in which the patterned photoresist layer and exposed polysilicon layer are exposed to a chemical which inhibits reaction of the photoresist layer with the etchant gas. For example, fluorine may be implanted in the photoresist layer and exposed polysilicon layer. The fluorine implantation step is advantageously performed subsequent to patterning the photoresist and prior to etching the polysilicon. After etching, the photoresist is typically removed.

The process of the invention produces relatively straight-walled geometrical features which use up less area of silicon, thereby permitting the fabrication of a larger number of operative devices in a given area of silicon. Most importantly, the etch delta variations due to pattern density variations of the mask are greatly improved.

BRIEF SUMMARY OF THE DRAWINGS

The foregoing features of the present invention can be more fully understood from the following detailed discussion of a specific illustrative embodiment thereof, presented hereinbelow in conjunction with the accompanying drawings in which.

DETAILED DESCRIPTION OF THE INVENTION

Figure 1:
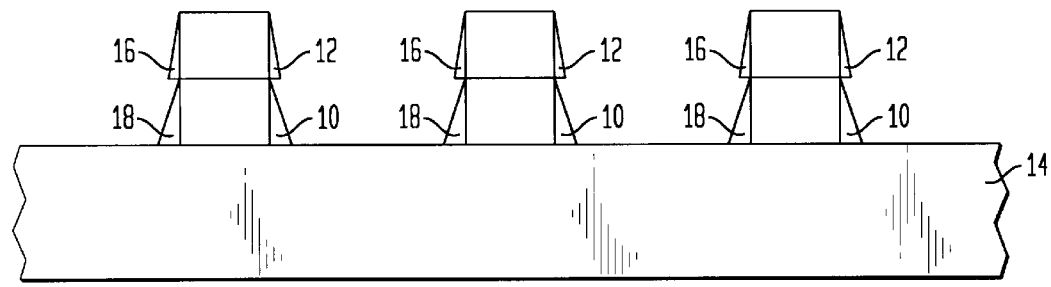
FIG. 1 is a cross-sectional view of an integrated circuit during a conventional process after the etching of the polysilicon illustrating the etch delta in the polysilicon.

FIG. 1 illustrates the stage in a conventional integrated circuit fabrication process after the etching of a polysilicon layer 10 left exposed by the patterning of a positive photoresist layer 12 having a neutral charge, both of which were previously deposited on the upper surface of a silicon substrate 14. Primarily as a result of the chemical reaction between the chlorine in the etching gas and the carbon in the photoresist layer 12 and the silicon in the polysilicon layer 10, sloping sidewalls 16, 18 are formed along the vertical walls of the photoresist layer 12 and polysilicon layer 10, respectively. The width of the polysilicon sidewall 18 at the substrate surface is known as the etch delta. The process of the invention, illustrated in FIGS. 2–5, substantially reduces this etch delta along with its sensitivity to pattern density.

Figure 2:
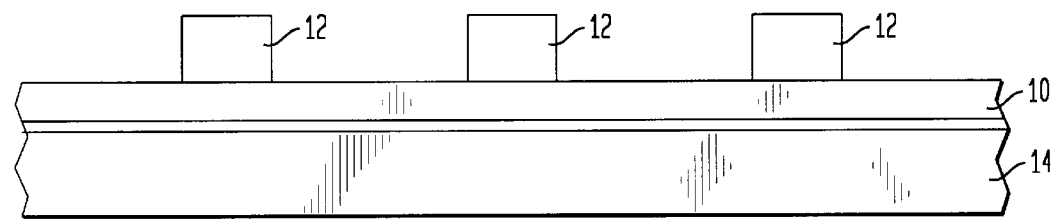
FIGS. 2–5 are cross-sectional views of an integrated circuit at successive stages of its fabrication by the method of the present invention.
Figure 3:
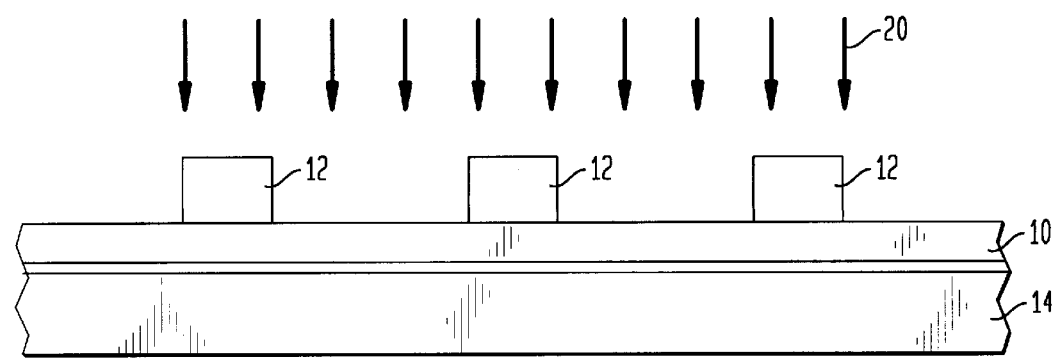

Referring to FIG. 2, there is shown a patterned photoresist layer 12 formed over a polysilicon layer 10, which, in turn, is formed over a substrate 14. FIG. 3 illustrates the implantation of ions into the patterned photoresist layer 12 and the exposed surface of the polysilicon layer 10 prior to the etching of the polysilicon layer. The implanted ions render the photoresist less reactive to the etchant. In a preferred version of the invention, the exposed photoresist 12 and the exposed polysilicon layer 10 are implanted with fluorine ions shown by the arrows 20, or ions of a fluoride such as boron difluoride ($BF_2+$) or hydrogen fluoride (HF). The dosage of fluorine ions is preferably in the range of $1e^{15}$–$4e^{15}$ atoms/$cm^2$ at an implantation energy of about 60 keV. Other ranges of fluorine ions may be implanted at other energies, as may be apparent to one of ordinary skill in the art. Also, in accordance with another aspect of the invention, the fluorine ions are directed at an angle of about 90 degrees, essentially perpendicular to the surface of the wafer. A further aspect of the invention implants the ions by a rotated implant.

The fluorine ions implanted into the patterned photoresist and polysilicon chemically react with the carbon in the photoresist 12, thereby altering chemically the surface of the photoresist 12, making it substantially less reactive with the chlorine in the etchant gas. The fluorine implantation hardens the photoresist and reduces the etch rate of the etchant gas, $Cl_2$/HBr, thereby reducing the amount of carbon in the plasma and reducing the formation or deposition of sidewalls on the photoresist. It is believed that the reduction in carbon release is due to the strength of the fluorine-carbon bond, which is stronger than the chlorine-carbon bond required for etching.

Figure 4:
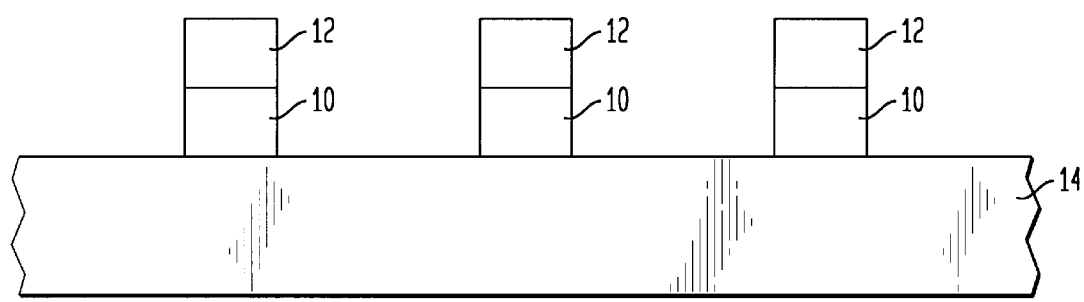
Figure 5:
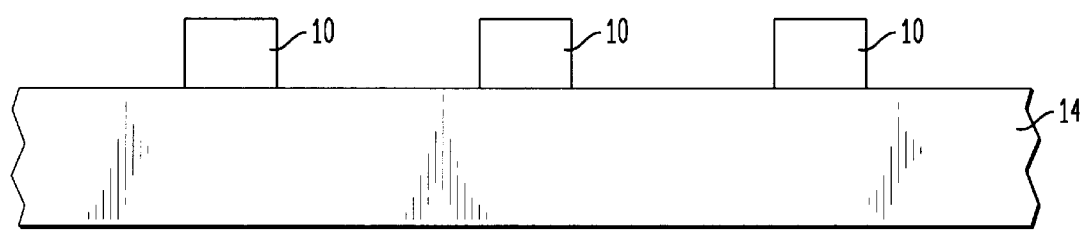

Referring now to FIG. 4, the structure is then subjected, as is conventional, to an etching operation by the use of a suitable etchant to remove the exposed portions of the polysilicon layer 10 not covered by the patterned photoresist. After etching, as shown in FIG. 5, the photoresist mask may be removed by conventional techniques, leaving the patterned polysilicon, which has minimal polysilicon etch delta. The sidewalls with minimal etch delta have a slope of about 87°.

The difference in the effect of the fluorine in the photoresist and polysilicon layers is due to the volatility of the reaction product in each layer. The photoresist layer, after implantation with fluorine, contains a fluorine-carbon product which is like plastic and remains on the surface of the layer. The fluorine-carbon product is not volatile, and therefore the fluorine-carbon product is not substantially removed during etching with the gas plasma. However, the polysilicon layer forms a fluorine-silicon product which is volatile. This product reacts with the gas plasma and is therefore removed during etching.

Thus, the method of the invention helps prevent the release of carbon from the photoresist layer, thereby providing reduced etch delta compared with many known methods. Therefore, the method of the invention provides a more controlled means of performing polysilicon gate etch, allowing consistent production of more closely spaced devices over a given area of silicon.

EXAMPLE

The following example is illustrative only and should not be construed as a limitation on the scope of the invention.

A photoresist layer is applied over a polysilicon layer on a substrate. The photoresist layer is exposed, developed and measured. A gate mask is formed on the photoresist, exposing parts of the polysilicon layer. The photoresist and exposed polysilicon layer are then implanted with $BF^{2+}$ ($3e^{15}$ atoms/cm$^2$) at an energy of 60 keV and an angle of 90°. An etchant gas, HBr/$Cl_2$, is then applied at a flow rate of 22–50 sccm at 170 Watts and 50 millitorr. The exposure to the etchant gas is continued for about 60 seconds until the polysilicon layer is clear. The photoresist layer is then removed.

The above-described process and example are intended to be merely illustrative of the principles of the present invention. Numerous modifications and adaptations thereof will be readily apparent to those of ordinary skill in this art without necessarily departing from the spirit and scope of the present invention.

We claim:

1. A method for fabricating an integrated circuit comprising:
   a) forming a polysilicon layer on a substrate;
   b) forming a patterned photoresist mask over said polysilicon layer;
   c) exposing said patterned photoresist mask to a chemical which implants ions to inhibit reaction of said mask with an etchant; and
   d) etching said polysilicon layer with said etchant, thereby patterning it.

2. The method of claim 1, wherein said implanted ions are fluorine ions.

3. The method of claim 1, wherein the chemical comprises a fluoride selected from the group consisting of F, HF and $BF_2$+.

4. The method of claim 1, wherein said ions are implanted by rotated implantation.

5. The method according to claim 1, wherein a sidewall of said etched polysilicon layer forms an angle of about 87 degrees with said substrate.

6. The method according to claim 1, wherein the dosage of said implanted ions is between $1e^{15}$ and $4e^5$ atoms/cm$^2$.

7. The method according to claim 1, wherein the angle of implantation of said ions is about 90 degrees.

8. The method according to claim 1, wherein the energy level of said ions is in the order of 60 keV.

9. The method of claim 1, wherein the etchant comprises chlorine.

* * * * *